(12) United States Patent
Kuribayashi et al.

(10) Patent No.: US 12,311,540 B2
(45) Date of Patent: May 27, 2025

(54) INDUSTRIAL ROBOT AND TEACHING METHOD FOR INDUSTRIAL ROBOT

(71) Applicant: NIDEC SANKYO CORPORATION, Nagano (JP)

(72) Inventors: Tamotsu Kuribayashi, Nagano (JP); Tetsuya Inomata, Nagano (JP); Wataru Murata, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 217 days.

(21) Appl. No.: 17/992,947

(22) Filed: Nov. 23, 2022

(65) Prior Publication Data
US 2023/0166392 A1    Jun. 1, 2023

(30) Foreign Application Priority Data

Nov. 30, 2021 (JP) .................................. 2021-194878

(51) Int. Cl.
*B25J 9/00* (2006.01)
*B25J 9/04* (2006.01)
*B25J 9/16* (2006.01)

(52) U.S. Cl.
CPC ............ *B25J 9/0081* (2013.01); *B25J 9/042* (2013.01); *B25J 9/1612* (2013.01); *B25J 9/163* (2013.01); *B25J 9/1692* (2013.01)

(58) Field of Classification Search
CPC ........ B25J 9/0081; B25J 9/042; B25J 9/1612; B25J 9/163; B25J 9/1692; B25J 9/1679; B25J 9/04; B25J 11/0095; B25J 13/08; H01L 21/67259; H01L 21/68; H01L 21/68707; H01L 21/67742;
(Continued)

(56) References Cited

U.S. PATENT DOCUMENTS 12,030,179 B2    7/2024  Toyomaki
2013/0178979 A1*  7/2013  Kimura ............ H01L 21/67766
                                                901/46
(Continued)

FOREIGN PATENT DOCUMENTS

JP    2019102695       6/2019
JP    2019102695 A  *  6/2019  ....... H01L 21/67259
(Continued)

*Primary Examiner* — Adam R Mott
*Assistant Examiner* — Joseph Anthony Trias
(74) *Attorney, Agent, or Firm* — JCIPRNET

(57) ABSTRACT

An industrial robot continuously and automatically executes a teaching step of learning a hand position that is the position of a hand when mounting a transported object to be placed in a predetermined position on a placing section, and a calibration step of correcting the hand position learned in the teaching step. In the calibration step, the hand is moved to the hand position identified in the teaching step, and a transported object for teaching placed in the predetermined position is mounted and taken out onto the hand. Thereafter, the hand is moved again to the hand position identified in the teaching step and the transported object for teaching is placed on the placing section. Afterward, the position of the transported object for teaching is detected by second sensors attached to the hand and the hand position is corrected based on the detection result by the second sensors.

5 Claims, 7 Drawing Sheets

(58) Field of Classification Search
CPC .......... H01L 21/67766; B65G 47/902; B65G 47/905; B65G 2203/042
USPC ...................................................... 700/264
See application file for complete search history.

(56) References Cited

U.S. PATENT DOCUMENTS

2016/0055425 A1* 2/2016 Minami ............... G05B 19/425
706/12
2017/0106533 A1* 4/2017 Minami .............. H01L 21/6773
2021/0057251 A1* 2/2021 Matsuoka ......... H01L 21/67742

FOREIGN PATENT DOCUMENTS

KR      20190066545     6/2019
KR      20210103409     8/2021

* cited by examiner

INDUSTRIAL ROBOT AND TEACHING METHOD FOR INDUSTRIAL ROBOT

CROSS REFERENCE TO RELATED APPLICATION

The present invention claims priority under 35 U.S.C. § 119 to Japanese Application No. 2021-194878 filed Nov. 30, 2021, the entire content of which is incorporated herein by reference.

FIELD OF THE INVENTION

The disclosure relates to an industrial robot for transporting a transported object. Also, the disclosure relates to a teaching method for an industrial robot for transporting a transported object.

BACKGROUND

Conventionally, a horizontally articulated industrial robot that transports a work has been known. The above industrial robot carries in a work on a stage and carries out a work from the stage. Automatic teaching for an industrial robot by which the industrial robot learns a position in an up-down direction and a position in a horizontal direction of a work stored on the stage is performed on the industrial robot. When automatic teaching is performed, a tool for teaching is attached to a hand of the industrial robot. The tool for teaching is provided with a first sensor to detect the position in the up-down direction of the work and a second sensor to detect the position in the horizontal direction of the work.

Correction (calibration) is performed before automatic teaching is performed on the above industrial robot. In performing calibration, an operator firstly places a work in an ideal position on the hand. Afterword, the industrial robot is operated to carry in the work placed on the hand and place the work on the stage. Thereafter, the aforementioned tool for teaching is attached to the hand, and then the industrial robot is operated to perform the same operation as automatic teaching, and the position in the horizontal direction of the work is detected by the second sensor. In addition, a correction value is calculated based on the detection result by the second sensor. When automatic teaching for the industrial robot ends, the position automatically taught is corrected based on the correction value calculated at the time of calibration.

In the case of the above industrial robot, a work and an operation at the time of performing automatic teaching and a work and an operation at the time of performing calibration are separated. The operator needs to perform the work and operation at the time of performing calibration in addition to the work and operation at the time of performing automatic teaching. Also, in the case of the industrial robot, manual works by the operator are included in the work at the time of performing calibration, and thus the works by the operator at the time of performing calibration are complicated. Therefore, in the case of the above industrial robot, the operator for performing calibration carries a heavy burden.

SUMMARY

An industrial robot according to an exemplary embodiment of the disclosure is an industrial robot for transporting a transported object, the industrial robot including: a hand on which the transported object is mounted; an arm with a distal end side to which the hand is connected rotatably about an up-down direction as an axis direction of rotation; and a controller that controls the industrial robot. The controller continuously and automatically executes a teaching step of allowing the industrial robot to learn a hand position that is a position in the up-down direction and a position in a horizontal direction of the hand when mounting, on the hand, the transported object placed in a predetermined position on a placing section on which the transported object is mounted and when placing, in the predetermined position, the transported object mounted on the hand, and a calibration step of, after the teaching step, correcting the hand position learned in the teaching step. At the time of execution of the teaching step, a dummy transported object provided in a shape identical to that of the transported object or the transported object is already placed in the predetermined position. When the transported object or the dummy transported object placed in the predetermined position is a transported object for teaching, in the teaching step, a position in the up-down direction of the transported object for teaching placed in the predetermined position is detected by a first sensor attached to the hand and a position in the horizontal direction of the transported object for teaching placed in the predetermined position is detected by a second sensor attached to the hand, and the controller identifies and learns the hand position based on detection results by the first sensor and the second sensor, and in the calibration step, the hand is moved to the hand position identified in the teaching step and the transported object for teaching placed in the predetermined position is mounted and taken out onto the hand, thereafter, the hand is moved again to the hand position identified in the teaching step and the transported object for teaching is placed on the placing section, and then the position in the horizontal direction of the transported object for teaching placed on the placing section is detected by the second sensor attached to the hand, and the controller corrects, based on a detection result by the second sensor, the position in the horizontal direction of the hand position learned in the teaching step.

A teaching method for an industrial robot according to another exemplary embodiment of the disclosure is a teaching method for an industrial robot including a hand on which a transported object is mounted, and an arm with a distal end side to which the hand is connected rotatably about an up-down direction as an axis direction of rotation, the teaching method including continuously and automatically executing a teaching step of allowing the industrial robot to learn a hand position that is a position in the up-down direction and a position in a horizontal direction of the hand when mounting, on the hand, the transported object placed in a predetermined position on a placing section on which the transported object is mounted and when placing, in the predetermined position, the transported object mounted on the hand, and a calibration step of, after the teaching step, correcting the hand position learned in the teaching step. At the time of execution of the teaching step, a dummy transported object provided in a shape identical to that of the transported object or the transported object is already placed in the predetermined position. When the transported object or the dummy transported object placed in the predetermined position is a transported object for teaching, in the teaching step, a position in the up-down direction of the transported object for teaching placed in the predetermined position is detected by a first sensor attached to the hand and a position in the horizontal direction of the transported object for teaching placed in the predetermined position is detected by a second sensor attached to the hand, and the controller identifies and learns the hand position based on detection results by the first sensor and the second sensor, and in the calibration step, the hand is moved to the hand position identified in the teaching step and the transported object for teaching placed in the predetermined position is mounted and taken out onto the hand, thereafter, the hand is moved again to the hand position identified in the teaching step and the transported object for teaching is placed on the placing section, and then the position in the horizontal direction of the transported object for teaching placed on the placing section is detected by the second sensor attached to the hand, and the controller corrects, based on a detection result by the second sensor, the position in the horizontal direction of the hand position learned in the teaching step.

The above and other elements, features, steps, characteristics and advantages of the present disclosure will become more apparent from the following detailed description of the preferred embodiments with reference to the attached drawings.

BRIEF DESCRIPTION OF THE DRAWINGS

Embodiments will now be described, by way of example only, with reference to the accompanying drawings which are meant to be exemplary, not limiting, and wherein like elements are numbered alike in several figures, in which.

DETAILED DESCRIPTION

Hereinafter, embodiments of the disclosure will be described with reference to the drawings.

Figure 1:
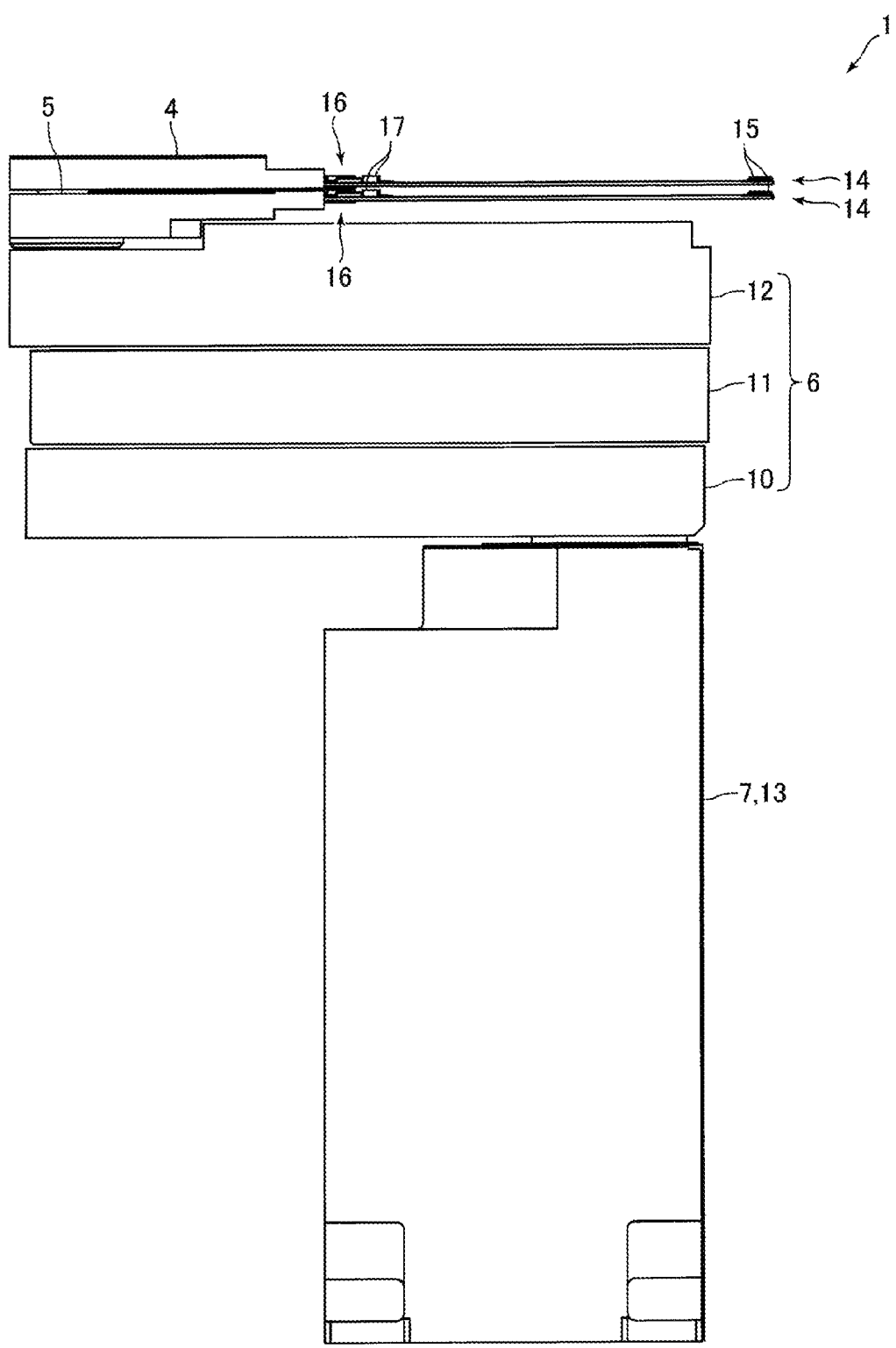
FIG. 1 is a side view of an industrial robot according to at least an embodiment of the disclosure.
Figure 2:
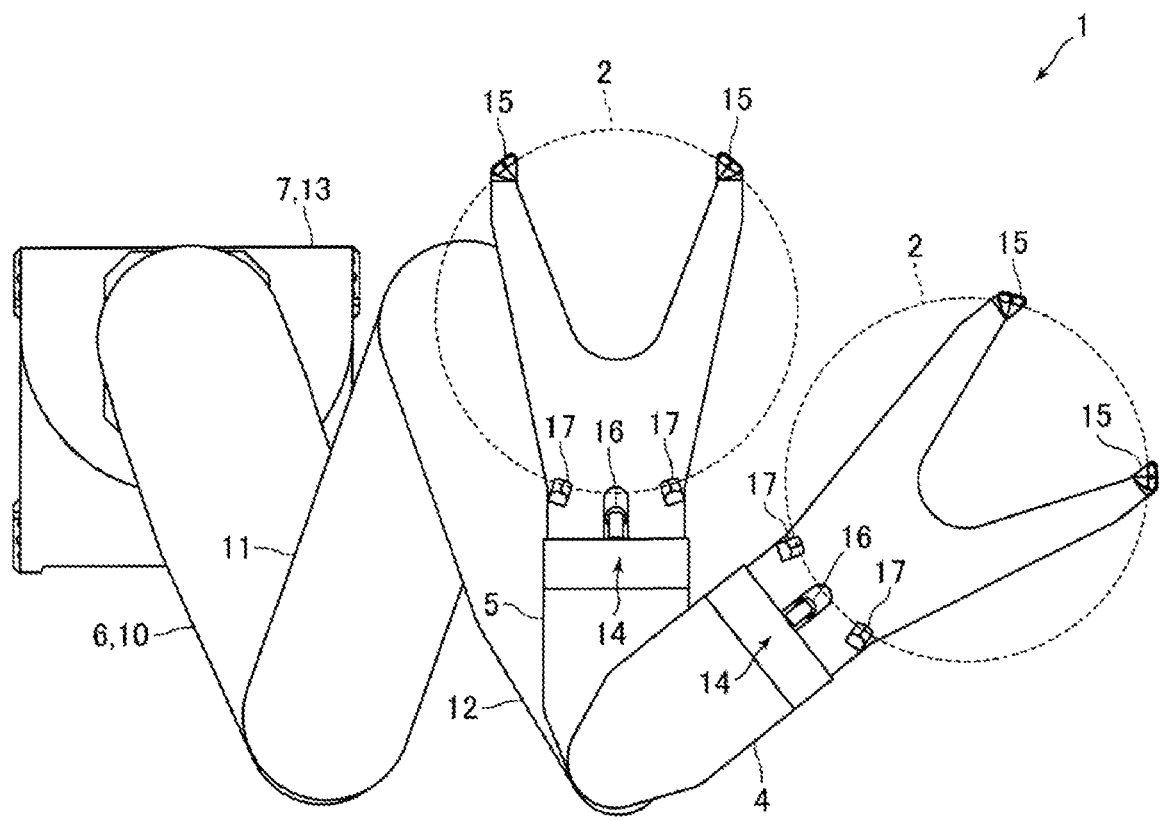
FIG. 2 is a plan view of the industrial robot illustrated in FIG. 1.
Figure 3:
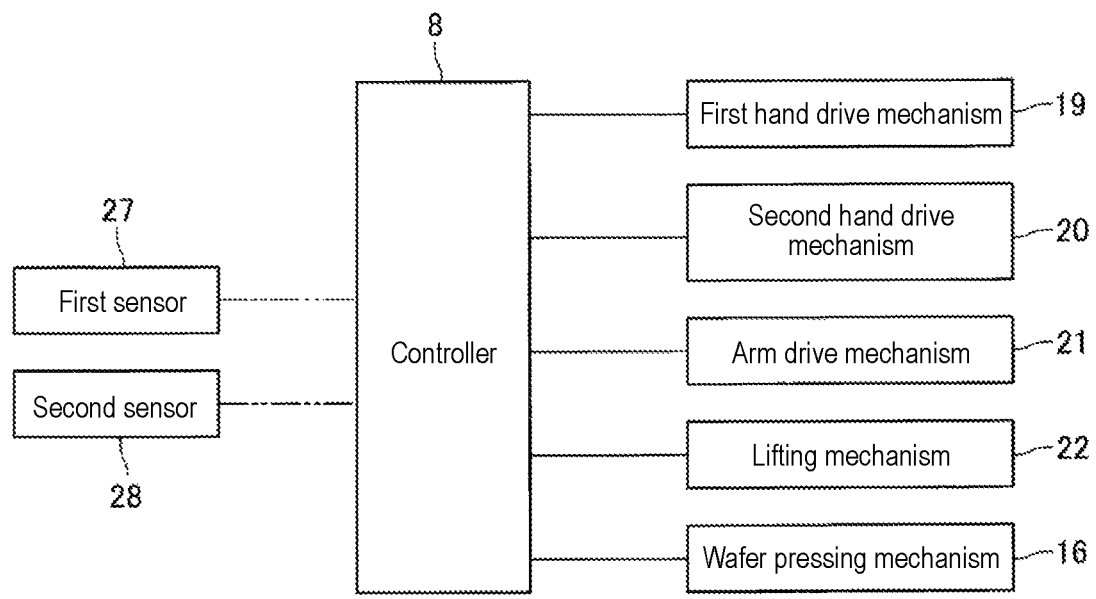
FIG. 3 is a block diagram for illustrating the configuration of the industrial robot illustrated in FIG. 1.

FIG. 1 is a side view of an industrial robot 1 according to at least an embodiment of the disclosure. FIG. 2 is a plan view of the industrial robot 1 illustrated in FIG. 1. FIG. 3 is a block diagram for illustrating the configuration of the industrial robot 1 illustrated in FIG. 1.

The industrial robot 1 of the present embodiment (hereinafter, referred to as "robot 1") is a horizontal articulated robot for transporting a semiconductor wafer 2 (hereinafter, referred to as "wafer 2") that is a transported object. The wafer 2 is provided in a disk shape. The robot 1 is mounted in a semiconductor manufacturing system to be used therein. The robot 1 transports the wafer 2 to a wafer placing section 3 (see FIG. 5, etc.) as a placing section on which the wafer 2 is placed. In other words, the robot 1 carries in the wafer 2 onto the wafer placing section 3 and carries out the wafer 2 from the wafer placing section 3. The wafer placing section 3 is, for example, a stage on which the wafer 2 is placed when predetermined processing is performed on the wafer 2. Additionally, the wafer placing section 3 is provided inside, for example, a Front-Opening Unified Pod (FOUP) in which a plurality of the wafers 2 are housed.

The robot 1 includes hands 4, 5 on each of which the wafer 2 is mounted, an arm 6 having a distal end side to which the hands 4, 5 are rotatably connected and being operable in a horizontal direction, and a main body 7 to which a base end side of the arm 6 is rotatably connected. Also, the robot 1 includes a controller 8 that controls the robot 1. The robot 1 of the present embodiment includes two hands 4, 5. In the present embodiment, the hand 4 is a first hand and the hand 5 is a second hand.

The arm 6 includes three arm portions 10 to 12 rotatably connected to each other. In other words, the arm 6 is an articulated arm. A base end side of the arm portion 10 is rotatably connected to the main body 7. A base end side of the arm portion 11 is rotatably connected to a distal end side of the arm portion 10. A base end side of the arm portion 12 is rotatably connected to a distal end side of the arm portion 11. The arm portions 10 to 12 rotate about an up-down direction (a vertical direction) as the axis direction of rotation. The main body 7 includes a housing 13 and a columnar member (not illustrated) to which the base end side of the arm portion 10 is rotatably connected. The base end side of the arm portion 10 is rotatably connected to an upper end portion of the columnar member. The main body 7, the arm portion 10, the arm portion 11, and the arm portion 12 are placed in the up-down direction in the mentioned order from the lower side.

The hands 4, 5 are each provided in a substantially Y-shape when viewed in the up-down direction. The hand 4 and the hand 5 are provided in the same shape. Base end portions of the hands 4, 5 are rotatably connected to a distal end side of the arm portion 12. The hands 4, 5 rotate about the up-down direction as the axis direction of rotation. The hands 4, 5 are individually rotatable with respect to the arm portion 12. The hands 4, 5 each include a grip mechanism 14 that is brought into contact from three directions with an end surface (outer circumferential surface) of the wafer 2 mounted on the hand 4, 5 to hold, at a fixed position in the horizontal direction, the wafer 2 mounted on the hand 4, 5. The grip mechanism 14 includes end surface contact members 15 with which the end surface of the wafer 2 is brought into contact, and a wafer pressing mechanism 16 that presses the wafer 2 such that the end surface of the wafer 2 is pressed against contact surfaces of the end surface contact members 15.

The end surface contact members 15 are placed at two locations on distal end portions of the hand 4, 5 provided in a substantially Y-shape. The wafer pressing mechanism 16 includes a pressing section that presses the end surface of the wafer 2 toward a distal end side of the hand 4, 5, and an air cylinder that drives the pressing section. The pressing section includes a roller that is brought into contact with the end surface of the wafer 2. The wafer pressing mechanism 16 is electrically connected to the controller 8. Specifically, a solenoid valve placed in a piping path of the air cylinder is electrically connected to the controller 8. Two wafer placing members 17 on which the wafer 2 is placed are fixed to an upper surface of the hand 4, 5, and the wafer 2 is mounted on the end surface contact members 15 and the wafer placing members 17. Note that the grip mechanism 14 may be configured to come into contact from four or more directions with the end surface of the wafer 2 mounted on the hand 4, 5 and hold the wafer 2.

The base end portion of the hand 4 and the base end portion of the hand 5 are overlapped in the up-down direction. In the present embodiment, the hand 4 is placed on the upper side, and the hand 5 is placed on the lower side. In other words, the hand 4 is placed above the hand 5. Additionally, the hands 4, 5 are placed above the arm portion 12. When viewed in the up-down direction, the center of rotation of the hand 4 with respect to the arm 6 (i.e., the center of rotation of the hand 4 with respect to the arm portion 12) is coincident with the center of rotation of the hand 5 with respect to the arm 6 (i.e., the center of rotation of the hand 5 with respect to the arm portion 12).

When the rotation angle of the hand 4 with respect to the arm 6 is equal to the rotation angle of the hand 5 with respect to the arm 6, the hand 4 and the hand 5 are overlapped in the up-down direction. In other words, when the rotation angle of the hand 4 with respect to the arm 6 is equal to the rotation angle of the hand 5 with respect to the arm 6, the wafer 2 mounted on the hand 4 and the wafer 2 mounted on the hand 5 are overlapped in the up-down direction. More specifically, when the rotation angle of the hand 4 with respect to the arm 6 is equal to the rotation angle of the hand 5 with respect to the arm 6, the center of the wafer 2 on the hand 4 held by the grip mechanism 14 is coincident with the center of the wafer 2 on the hand 5 held by the grip mechanism 14 when viewed in the up-down direction.

The robot 1 includes a first hand drive mechanism 19 that rotates the hand 4 to the arm 6, a second hand drive mechanism 20 that rotates the hand 5 to the arm 6, an arm drive mechanism 21 that extends and retracts the arm 6, which is an articulated arm, and a lifting mechanism 22 that lifts the arm 6 up and down. The first hand drive mechanism 19, the second hand drive mechanism 20, the arm drive mechanism 21, and the lifting mechanism 22 are electrically connected to the controller 8. Specifically, a motor or the like, which is a drive source of the first hand drive mechanism 19, the second hand drive mechanism 20, the arm drive mechanism 21, and the lifting mechanism 22 is electrically connected to the controller 8.

The arm drive mechanism 21 includes a first drive mechanism that rotates the arm portions 10, 11 to extend and retract a portion of the arm 6 composed of the arm portion 10 and the arm portion 11, and a second drive mechanism that rotates the arm portion 12 to the arm portion 11. The lifting mechanism 22 lifts the columnar member of the main body 7 up and down. The lifting mechanism 22 is housed in the housing 13. The lifting mechanism 22 lifts the hands 4, 5 and the arm 6 up and down together with the columnar member.

Figure 4A:
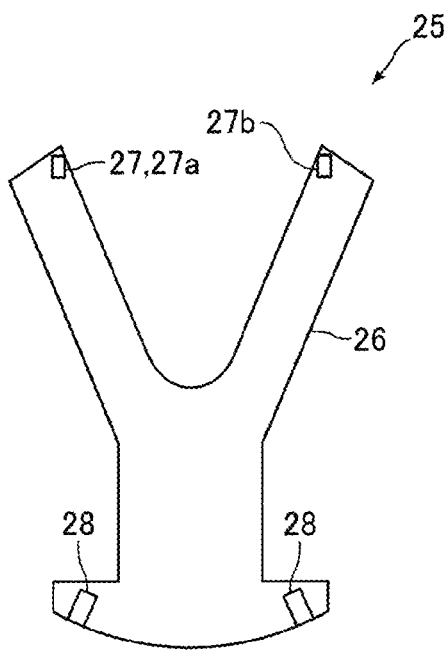
FIG. 4A and FIG. 4B are plan views of a tool used when teaching for the industrial robot illustrated in FIG. 1 is performed.
Figure 4B:
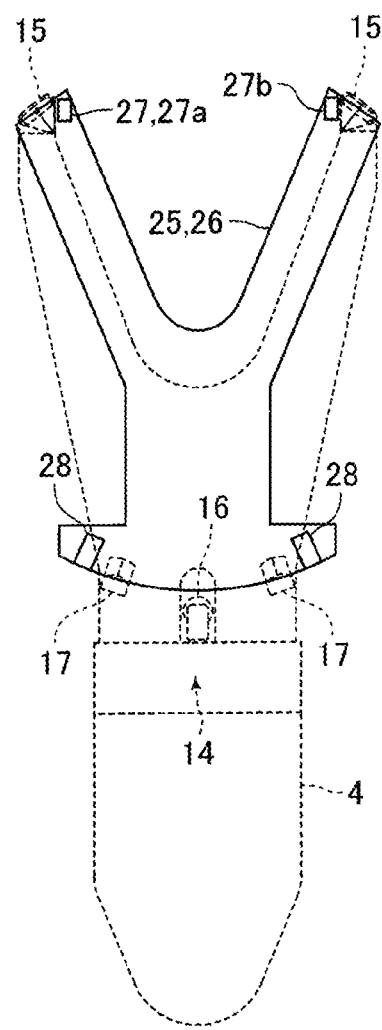
Figure 5:
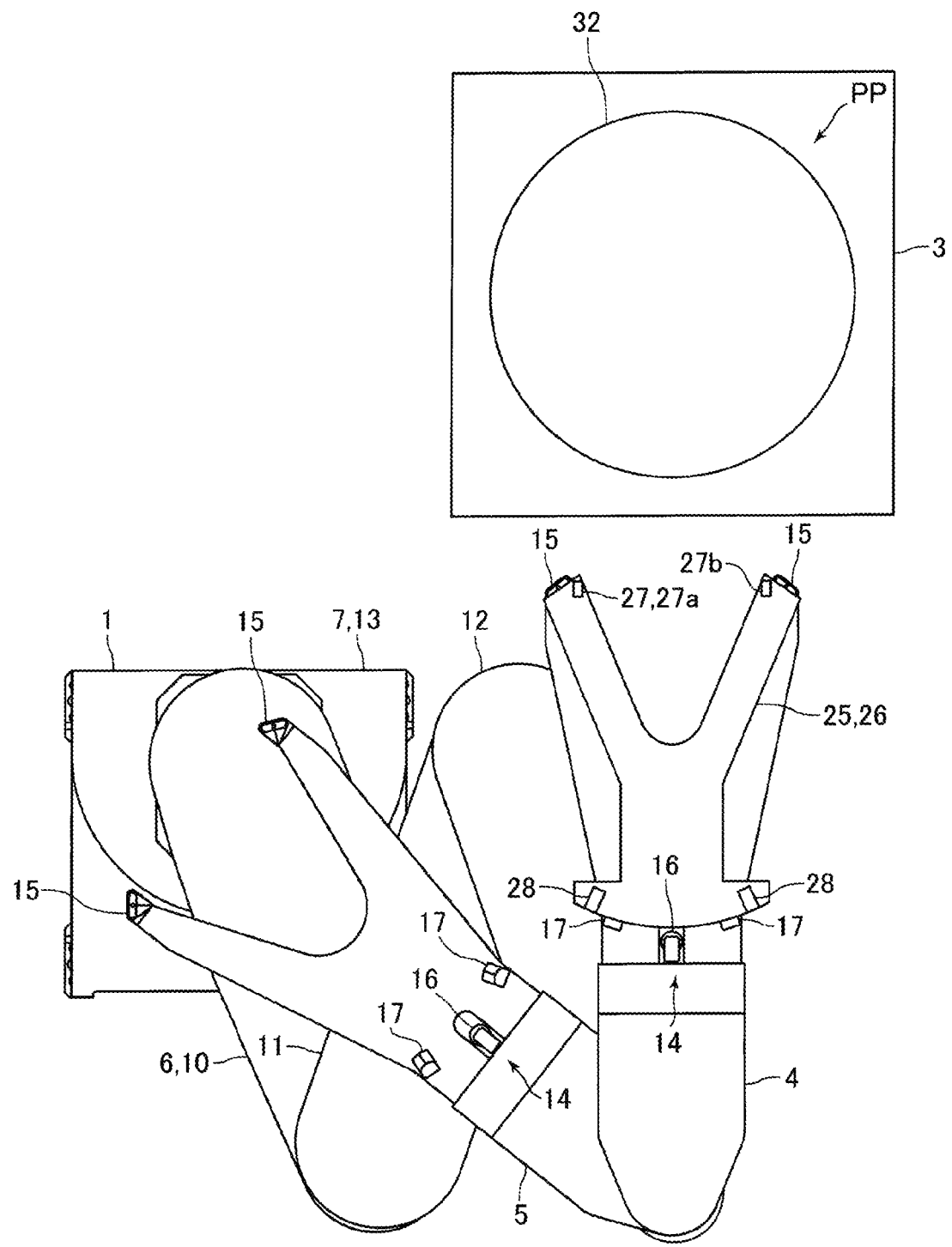
FIG. 5 is a plan view for illustrating movement in a teaching step of the industrial robot illustrated in FIG. 1.
Figure 6A:
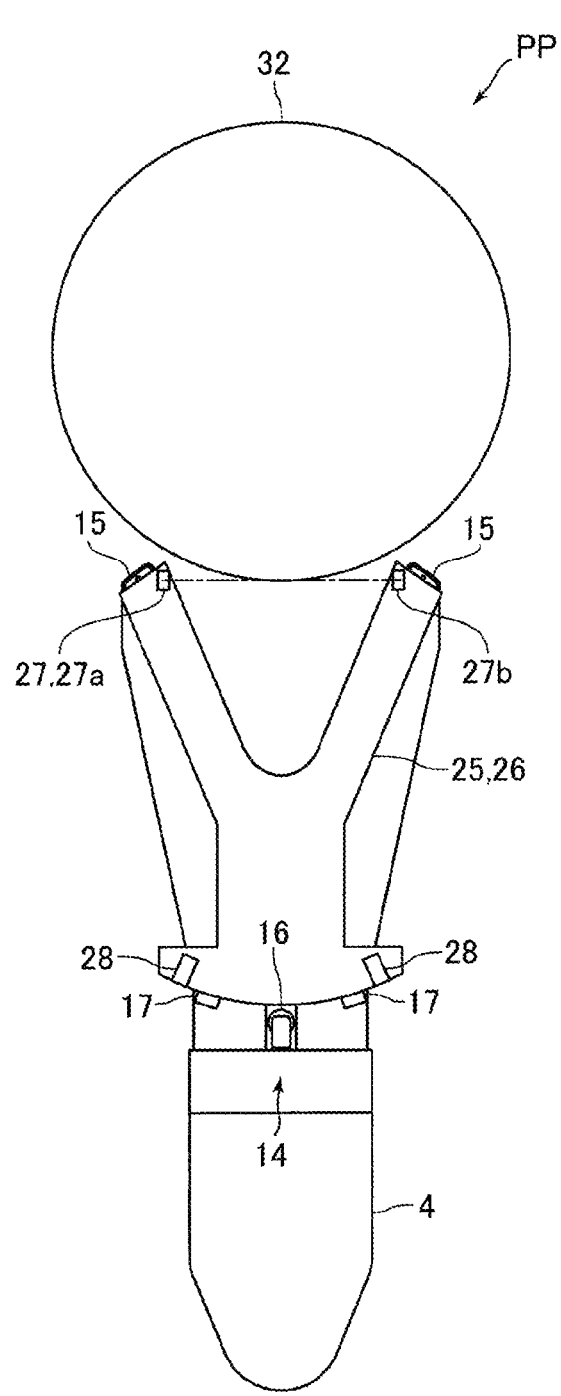
FIG. 6A and FIG. 6B are plan views for illustrating movement in the teaching step of the industrial robot illustrated in FIG. 1.
Figure 6B:
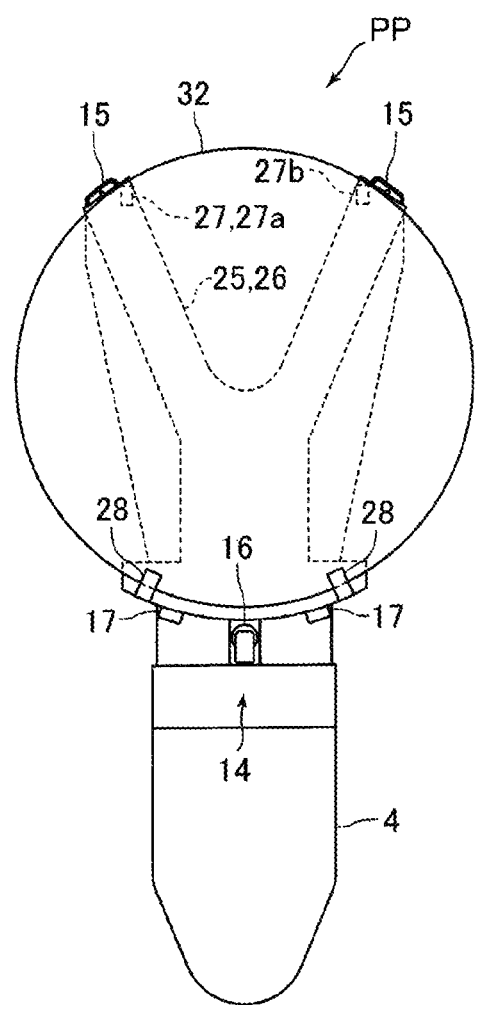
Figure 7:
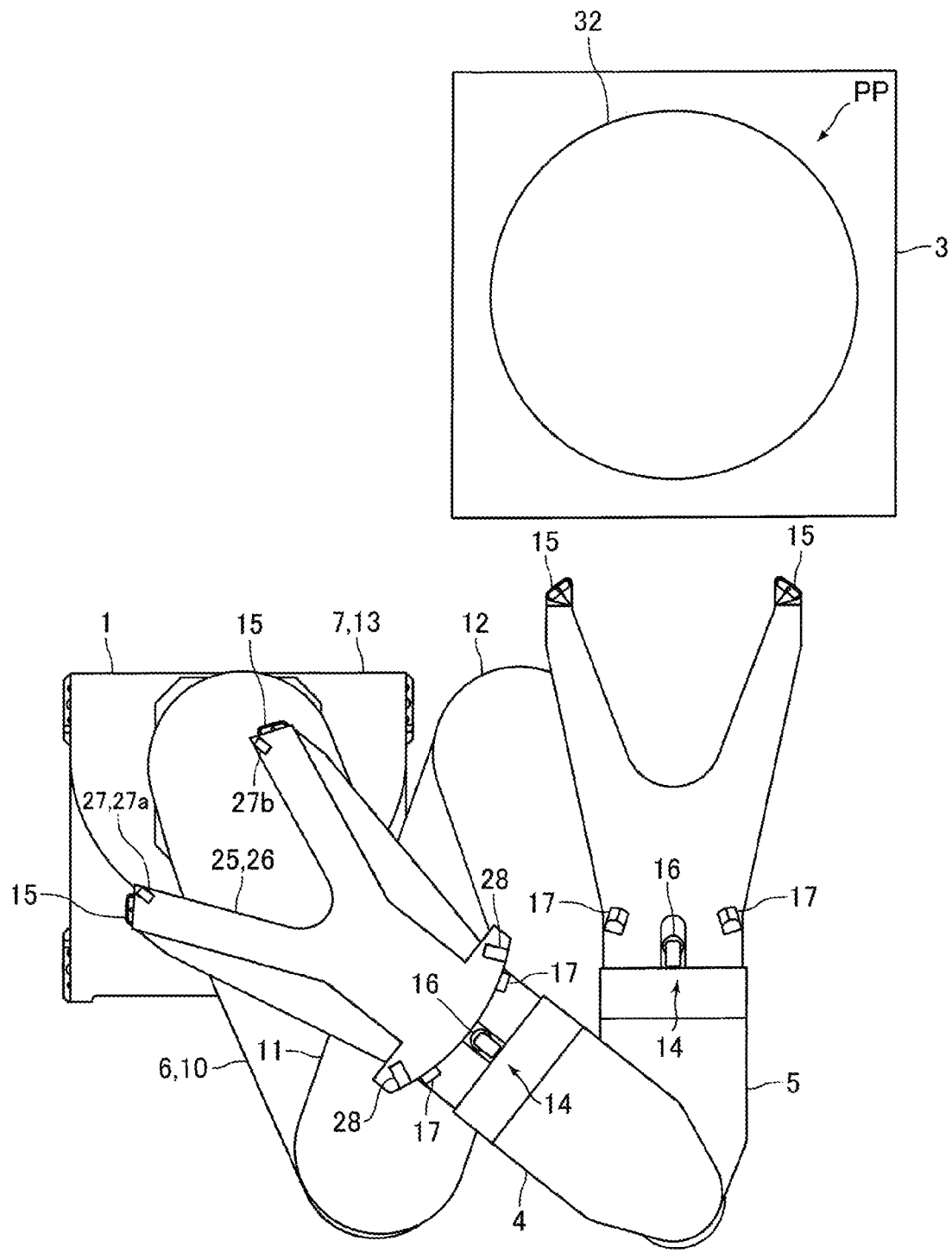
FIG. 7 is a plan view for illustrating movement in a calibration step of the industrial robot illustrated in FIG. 1.
Figure 8A:
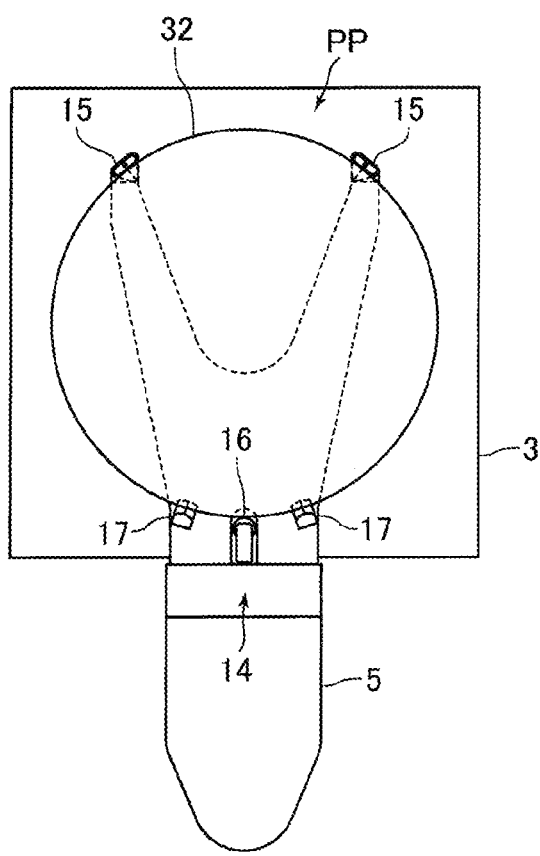
FIG. 8A and FIG. 8B are plan views for illustrating movement in the calibration step of the industrial robot illustrated in FIG. 1.
Figure 8B:
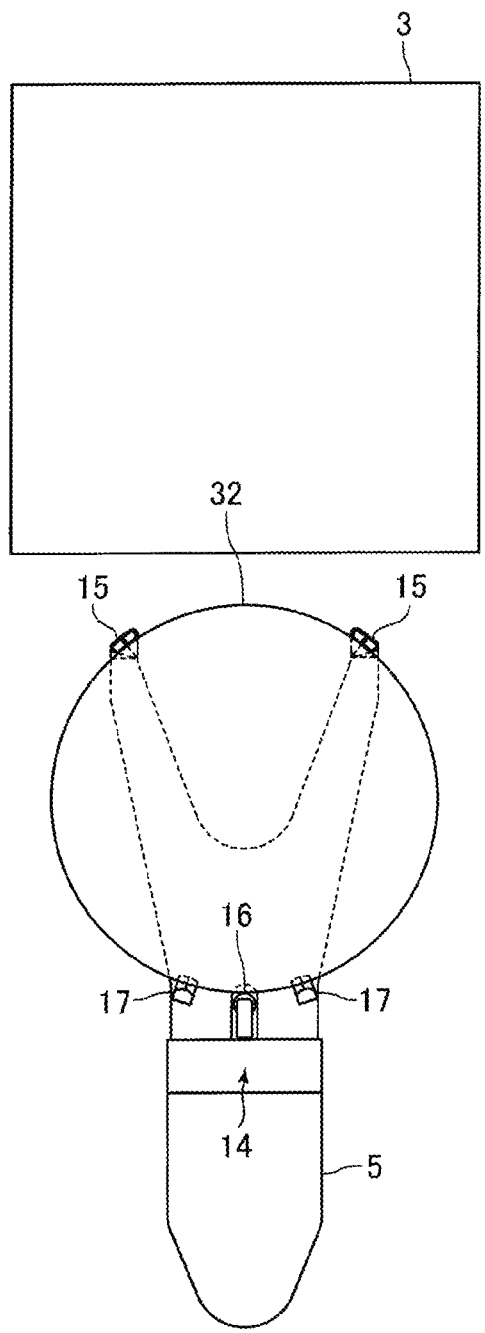

FIG. 4A and FIG. 4B are plan views of a tool 25 used when teaching for the robot 1 illustrated in FIG. 1 is performed. FIG. 5, FIG. 6A and FIG. 6B are plan views for illustrating movement in a teaching step of the robot 1 illustrated in FIG. 1. FIG. 7, FIG. 8A and FIG. 8B are plan views for illustrating movement in a calibration step of the robot 1 illustrated in FIG. 1.

Teaching for appropriately transporting the wafer 2 to the wafer placing section 3 is performed on the robot 1. In the event of performing teaching for the robot 1, the controller 8 continuously and automatically executes a teaching step of allowing the robot 1 to learn a hand position HP that is a position in the up-down direction and a position in the horizontal direction of the hand 4, 5 when mounting, on the hand 4, 5, the wafer 2 placed in a predetermined position PP on the wafer placing section 3 and when placing, in the predetermined position PP on the wafer placing section 3, the wafer 2 mounted on the hand 4, 5, and a calibration step of, after the teaching step, correcting (calibrating) the hand position HP learned in the teaching step.

In the teaching step and the calibration step, the controller 8 controls the wafer pressing mechanism 16, the first hand drive mechanism 19, the second hand drive mechanism 20, the arm drive mechanism 21, and the lifting mechanism 22 to operate the robot 1. In other words, in the teaching step and the calibration step, the robot 1 automatically operates, and in the teaching step and the calibration step, there is no manual work performed by an operator who performs teaching for the robot 1.

In the event of performing teaching for the robot 1, a dummy wafer 32 as a dummy transported object provided in the same shape as the wafer 2 is used. Additionally, in the event of performing teaching for the robot 1, the tool 25 for teaching is used. The tool 25 is attached to the upper surface of the hand 4. In other words, when the teaching step and the calibration step are executed, the tool 25 is already attached to the hand 4. As illustrated in FIG. 4A and FIG. 4B, the tool 25 includes a tool body 26 provided in a thin flat plate shape, a first sensor 27 to detect a position in the up-down direction of the dummy wafer 32, and two second sensors 28 to detect a position in the horizontal direction of the dummy wafer 32. The first sensor 27 and the second sensors 28 are used when teaching for the robot 1 is performed, but are not used when the robot 1 transports the wafer 2.

The tool body 26 is attached to the upper surface of the hand 4 such that the thickness direction of the tool body 26 coincides with the up-down direction. The tool body 26 is provided in a substantially Y-shape when viewed in the up-down direction. The first sensor 27 and the second sensors 28 are attached to the tool body 26. The first sensor 27 is a transmissive optical sensor including a light emitter 27*a* and a light receiver 27*b*. The second sensor 28 is a transmissive optical sensor including a light emitter and a light receiver in the same way as the first sensor 27. In the event of attaching the tool 25 to the hand 4, the wiring of the first sensor 27 and the wiring of the second sensors 28 are connected to the wiring on the hand 4 side. When the tool 25 is attached to the upper surface of the hand 4, the first sensor 27 and the second sensors 28 are electrically connected to the controller 8.

The light emitter 27*a* and the light receiver 27*b* of the first sensor 27 are placed opposed to each other with a predetermined gap in the horizontal direction. When the tool 25 is attached to the upper surface of the hand 4, the light emitter 27*a* is placed near one end surface contact member 15 of the two end surface contact members 15, and the light receiver 27*b* is placed near the other end surface contact member 15. The light emitter and the light receiver of the second sensor 28 are placed opposed to each other with a predetermined gap in the up-down direction. The second sensors 28 are attached to the upper surface side of the tool body 26. When the tool 25 is attached to the upper surface of the hand 4, one second sensor 28 of the two second sensors 28 is placed near one wafer placing member 17 of the two wafer placing members 17, and the other second sensor 28 is placed near the other wafer placing member 17.

Before the teaching step is executed, the tool 25 is attached to the hand 4. Also, before the teaching step is executed, the dummy wafer 32 is placed in the predetermined position PP on the wafer placing section 3. In other words, at the time of execution of the teaching step, the dummy wafer 32 is already placed in the predetermined position PP. The tool 25 is attached to the hand 4 by the operator who performs teaching for the robot 1. The dummy wafer 32 is placed in the predetermined position PP by the operator. The dummy wafer 32 of the present embodiment is a transported object for teaching to be placed in the predetermined position PP. Additionally, before the teaching step is executed, the hand 4 to which the tool 25 is attached is placed in front of the wafer placing section 3 (see FIG. 5).

Thereafter, the controller 8 receives a teaching start command signal for the robot 1. Upon receiving the teaching start command signal, the controller 8 executes the teaching step. In the teaching step, the position in the up-down direction of the dummy wafer 32 placed in the predetermined position PP is detected by the first sensor 27, and the position in the horizontal direction of the dummy wafer 32 placed in the predetermined position PP is detected by the second sensors 28. In addition, the controller 8 identifies the aforementioned hand position HP based on the detection results by the first sensor 27 and the second sensors 28.

In the teaching step, firstly, the position in the up-down direction of the dummy wafer 32 placed in the predetermined position PP is detected by the first sensor 27 attached to the hand 4, and then the position in the horizontal direction of the dummy wafer 32 placed in the predetermined position PP is detected by the second sensors 28 attached to the hand 4. Note that the operation performed by the robot 1 in the teaching step of the present embodiment is the same as the operation performed by the industrial robot when automatic teaching is performed on the conventional industrial robot.

In the event of detecting the position in the up-down direction of the dummy wafer 32 placed in the predetermined position PP by the first sensor 27, the hand 4 placed in front of the wafer placing section 3 is moved toward the dummy wafer 32. In this case, the hand 4 is moved in a reciprocating manner in the up-down direction with a constant amplitude. For example, the hand 4 is moved in a reciprocating manner in the up-down direction such that the hand 4 moves in a rectangular wave shape. As the hand 4 moves toward the dummy wafer 32 in a reciprocating manner in the up-down direction, the light from the light emitter 27a toward the light receiver 27b of the first sensor 27 is eventually blocked by the dummy wafer 32 (see FIG. 6A). Thus, the position in the up-down direction of the dummy wafer 32 placed in the predetermined position PP is detected.

After the position in the up-down direction of the dummy wafer 32 placed in the predetermined position PP is detected, the hand 4 is temporarily moved back to the front of the wafer placing section 3. Thereafter, the height of the hand 4 is set based on the detection result of the position in the up-down direction of the dummy wafer 32, and then the hand 4 is linearly moved toward the dummy wafer 32 in order to detect, by the second sensors 28, the position in the horizontal direction of the dummy wafer 32 placed in the predetermined position PP.

As the hand 4 moves toward the dummy wafer 32, the light from the light emitter toward the light receiver of the second sensor 28 is eventually blocked by the dummy wafer 32. In the event of detecting the position in the horizontal direction of the dummy wafer 32 placed in the predetermined position PP, the position of the hand 4 in a direction orthogonal to the moving direction of the hand 4 is adjusted such that the light from the light emitters toward the light receivers of the two second sensors 28 is blocked by the dummy wafer 32 at the same time (see FIG. 6B).

For example, when only the light from the light emitter toward the light receiver of one second sensor 28 of the two second sensors 28 is blocked by the dummy wafer 32, the movement of the hand 4 toward the dummy wafer 32 is stopped, and the hand 4 is moved in the direction orthogonal to the moving direction of the hand 4 to the position in which the light from the light emitter toward the light receiver of the other second sensor 28 is blocked by the dummy wafer 32. Afterward, the hand 4 is moved back to the front of the wafer placing section 3, and is moved again toward the dummy wafer 32.

When the light from the light emitters toward the light receivers of the two second sensors 28 is blocked by the dummy wafer 32 at the same time (see FIG. 6B), the position in the horizontal direction of the dummy wafer 32 placed in the predetermined position PP is detected. When the positions in the up-down direction and the horizontal direction of the dummy wafer 32 placed in the predetermined position PP are detected, the controller 8 identifies the hand position HP based on the detection results by the first sensor 27 and the second sensors 28 as described above.

Thereafter, the controller 8 executes the calibration step. Since the calibration step is executed following the teaching step, the dummy wafer 32 is already placed in the predetermined position PP on the wafer placing section 3 at the start of the calibration step. In the calibration step, as illustrated in FIG. 7, firstly, the hand 5 is automatically placed in front of the wafer placing section 3. Afterward, the hand 5 is moved to the hand position HP identified in the teaching step (see FIG. 8A), and then the dummy wafer 32 placed in the predetermined position PP is mounted and taken out onto the hand 5 (see FIG. 8B). For example, as illustrated in FIG. 8B, the dummy wafer 32 mounted on the hand 5 is taken out to the front of the wafer placing section 3. The dummy wafer 32 mounted on the hand 5 is held at a fixed position by the grip mechanism 14.

Afterward, the hand 5 is moved again to the hand position HP identified in the teaching step (see FIG. 8A), and the dummy wafer 32 is placed on the wafer placing section 3. In this case, it is ideal that the dummy wafer 32 is placed in the predetermined position PP; however, in practice, the dummy wafer 32 is placed in a position slightly displaced from the predetermined position PP on the wafer placing section 3. In other words, the dummy wafer 32 is placed near the predetermined position PP.

Thereafter, the robot 1 is allowed to perform the same operation performed at the time of detecting the position in the horizontal direction of the dummy wafer 32 in the teaching step, and the position in the horizontal direction of the dummy wafer 32 placed on the wafer placing section 3 is detected by the second sensors 28. In this case also, when the light from the light emitters toward the light receivers of the two second sensors 28 is blocked by the dummy wafer 32 at the same time, the position in the horizontal direction of the dummy wafer 32 placed on the wafer placing section 3 is detected. Then, the controller 8 corrects, based on the detection result by the second sensors 28, the position in the horizontal direction of the hand position HP learned in the teaching step.

As described above, in the present embodiment, the controller 8 continuously and automatically executes the teaching step of allowing the robot 1 to learn the hand position HP and the calibration step of, after the teaching step, correcting the hand position HP learned in the teaching step. Additionally, in the present embodiment, in the calibration step, the hand 5 is moved to the hand position HP identified in the teaching step, and the dummy wafer 32 placed in the predetermined position PP is mounted and taken out onto the hand 5. Thereafter, the hand 5 is moved again to the hand position HP identified in the teaching step and the dummy wafer 32 is placed on the wafer placing section 3. Afterward, the position in the horizontal direction of the dummy wafer 32 placed on the wafer placing section 3 is detected by the second sensors 28 and the horizontal position of the hand position HP learned in the teaching step is corrected based on the detection result by the second sensors 28.

Therefore, in the present embodiment, an operator performs a work and an operation to execute the teaching step, and thus a work and an operation to execute the calibration step are able to be automatically performed while the work and the operation to execute the calibration step are not performed by the operator. As a result, in the present embodiment, even in a case where calibration for correcting the position automatically taught in the teaching step is performed, a burden of the operator for performing the calibration is able to be reduced.

In the present embodiment, in the calibration step, the dummy wafer 32 is transported by the hand 5 to which the first sensor 27 and the second sensors 28 are not attached. Therefore, in the present embodiment, for example, even in a case where the first sensor 27 or the second sensors 28 are placed in a position in which transportation of the dummy wafer 32 by the hand 4 may be disturbed, the dummy wafer 32 is able to be transported by the hand 5 with the first sensor 27 and the second sensors 28 attached to the hand 4.

In the present embodiment, the tool 25 includes the first sensor 27 and the second sensors 28. Therefore, in the present embodiment, even in a case where the first sensor 27 or the second sensors 28 are placed in a position in which transportation of the dummy wafer 32 by the hand 4 may be disturbed, the first sensor 27 and the second sensors 28 are able to be easily removed from the hand 4 after teaching for the robot 1 is performed. Further, in the event of performing teaching for the robot 1, the first sensor 27 and the second sensors 28 are able to be easily attached to the hand 4. Furthermore, in the present embodiment, since the hand 4 to which the tool 25 is attached is placed above the hand 5, the tool 25 is easily attached compared to a case where the tool 25 is attached to the hand 5.

The embodiment described above is an example of the preferred embodiment of the disclosure, but is not limited thereto, and various modifications are able to be made without changing the scope of the disclosure.

In the embodiment described above, in the calibration step, after the dummy wafer 32 is carried out and carried in, the position in the horizontal direction of the dummy wafer 32 placed on the wafer placing section 3 is detected by the second sensors 28 and the position in the horizontal direction of the hand position HP learned in the teaching step is corrected based on the detection result by the second sensors 28. However, in the calibration step, after the dummy wafer 32 is carried out and carried in, the position in the up-down direction of the dummy wafer 32 placed on the wafer placing section 3 is detected by the first sensor 27 and the position in the horizontal direction of the dummy wafer 32 placed on the wafer placing section 3 is detected by the second sensors 28, and the hand position HP learned in the teaching step may be corrected based on the detection results by the first sensor 27 and the second sensors 28. In other words, in the calibration step, the positions in the up-down direction and the horizontal direction of the hand position HP learned in the teaching step may be corrected.

In the embodiment described above, the tool 25 may be attached to the hand 5. In this case, the hand 5 is used in the teaching step. In this case, the hand 5 is the first hand and the hand 4 is the second hand. In other words, the second hand may be placed above the first hand. Additionally, in the embodiment described above, the wafer 2 may be used in place of the dummy wafer 32 when teaching for the robot 1 is performed. In this case, the wafer 2 is a transported object for teaching.

In the embodiment described above, the first sensor 27 may be directly attached to the hand 4. Also, the second sensors 28 may be directly attached to the hand 4. In a case where the first sensor 27 and the second sensors 28 are directly attached to the hand 4, the tool 25 is unnecessary. Further, in a case where the first sensor 27 and the second sensors 28 are directly attached to the hand 4, the first sensor 27 or the second sensors 28 are placed in a position in which transportation of the dummy wafer 32 by the hand 4 may be disturbed. In such a case, before teaching for the robot 1 starts, the first sensor 27 and the second sensors 28 are attached to the hand 4, and after teaching for the robot 1 ends, the first sensor 27 and the second sensors 28 are removed from the hand 4.

Furthermore, In a case where the first sensor 27 and the second sensors 28 are directly attached to the hand 4, the first sensor 27 or the second sensors 28 are placed in a position in which transportation of the dummy wafer 32 by the hand 4 may not be disturbed. In such a case, the robot 1 does not need to be provided with the hand 5. In this case, in the calibration step, the hand 4 is moved to the hand position HP identified in the teaching step and the dummy wafer 32 placed in the predetermined position PP is mounted and taken out onto the hand 4. Thereafter, the hand 4 is moved again to the hand position HP identified in the teaching step and the dummy wafer 32 is placed on the wafer placing section 3. Even in this case, an operator performs a work and an operation to execute the teaching step, and thus a work and an operation to execute the calibration step are able to be automatically performed without performing the work and the operation to execute the calibration step by the operator. Therefore, even in a case where calibration for correcting the position automatically taught in the teaching step is performed, a burden of the operator for performing the calibration is able to be reduced.

In the embodiment described above, the arm 6 may include two arm portions or may include four or more arm portions. Additionally, in the embodiment described above, the robot 1 may be a robot for transporting a transported object other than the wafer 2.

An industrial robot according to at least an embodiment of the disclosure is an industrial robot for transporting a transported object, the industrial robot including: a hand on which the transported object is mounted; an arm with a distal end side to which the hand is connected rotatably about an up-down direction as an axis direction of rotation; and a controller that controls the industrial robot. The controller continuously and automatically executes a teaching step of allowing the industrial robot to learn a hand position that is a position in the up-down direction and a position in a horizontal direction of the hand when mounting, on the hand, the transported object placed in a predetermined position on a placing section on which the transported object is mounted and when placing, in the predetermined position, the transported object mounted on the hand, and a calibration step of, after the teaching step, correcting the hand position learned in the teaching step. At the time of execution of the teaching step, a dummy transported object provided in a shape identical to that of the transported object or the transported object is already placed in the predetermined position. When the transported object or the dummy transported object placed in the predetermined position is a transported object for teaching, in the teaching step, a position in the up-down direction of the transported object for teaching placed in the predetermined position is detected by a first sensor attached to the hand and a position in the horizontal direction of the transported object for teaching placed in the predetermined position is detected by a second sensor attached to the hand, and the controller identifies and learns the hand position based on detection results by the first sensor and the second sensor, and in the calibration step, the hand is moved to the hand position identified in the teaching step and the transported object for teaching placed in the predetermined position is mounted and taken out onto the hand, thereafter, the hand is moved again to the hand position identified in the teaching step and the transported object for teaching is placed on the placing section, and then the position in the horizontal direction of the transported object for teaching placed on the placing section is detected by the second sensor attached to the hand, and the controller corrects, based on a detection result by the second sensor, the position in the horizontal direction of the hand position learned in the teaching step.

A teaching method for an industrial robot according to at least an embodiment of the disclosure is a teaching method for an industrial robot including a hand on which a transported object is mounted, and an arm with a distal end side to which the hand is connected rotatably about an up-down direction as an axis direction of rotation, the teaching method including continuously and automatically executing a teaching step of allowing the industrial robot to learn a hand position that is a position in the up-down direction and a position in a horizontal direction of the hand when mounting, on the hand, the transported object placed in a predetermined position on a placing section on which the transported object is mounted and when placing, in the predetermined position, the transported object mounted on the hand, and a calibration step of, after the teaching step, correcting the hand position learned in the teaching step. At the time of execution of the teaching step, a dummy transported object provided in a shape identical to that of the transported object or the transported object is already placed in the predetermined position. When the transported object or the dummy transported object placed in the predetermined position is a transported object for teaching, in the teaching step, a position in the up-down direction of the transported object for teaching placed in the predetermined position is detected by a first sensor attached to the hand and a position in the horizontal direction of the transported object for teaching placed in the predetermined position is detected by a second sensor attached to the hand, and the controller identifies and learns the hand position based on detection results by the first sensor and the second sensor, and in the calibration step, the hand is moved to the hand position identified in the teaching step and the transported object for teaching placed in the predetermined position is mounted and taken out onto the hand, thereafter, the hand is moved again to the hand position identified in the teaching step and the transported object for teaching is placed on the placing section, and then the position in the horizontal direction of the transported object for teaching placed on the placing section is detected by the second sensor attached to the hand, and the controller corrects, based on a detection result by the second sensor, the position in the horizontal direction of the hand position learned in the teaching step.

In at least an embodiment of the disclosure, the teaching step of allowing the industrial robot to learn the hand position that is a position in the up-down direction and a position in the horizontal direction of the hand when mounting, on the hand, the transported object placed in the predetermined position on the placing section on which the transported object is mounted and when placing, in the predetermined position, the transported object mounted on the hand, and the calibration step of, after the teaching step, correcting the hand position learned in the teaching step are continuously and automatically executed.

Furthermore, in at least an embodiment of the disclosure, in the calibration step, the hand is moved to the hand position identified in the teaching step and the transported object for teaching placed in the predetermined position is mounted and taken out onto the hand, thereafter, the hand is moved again to the hand position identified in the teaching step and the transported object for teaching is placed on the placing section, and then the position in the horizontal direction of the transported object for teaching placed on the placing section is detected by the second sensor attached to the hand, and the position in the horizontal direction of the hand position learned in the teaching step is corrected based on a detection result by the second sensor.

Therefore, in at least an embodiment of the disclosure, an operator performs a work and an operation to execute the teaching step, and thus a work and an operation to execute the calibration step are able to be automatically performed while the work and the operation to execute the calibration step are not performed by the operator. As a result, in at least an embodiment of the disclosure, even in a case where calibration for correcting the position automatically taught in the teaching step is performed, a burden of the operator for performing the calibration is able to be reduced.

In at least an embodiment of the disclosure, the industrial robot includes, as the hand, a first hand and a second hand. One of the first hand and the second hand is placed above the other of the first hand and the second hand. As viewed in the up-down direction, when a rotation center of the first hand to the arm coincides with a rotation center of the second hand to the arm and when a rotation angle of the first hand to the arm is equal to a rotation angle of the second hand to the arm, the transported object mounted on the first hand is overlapped with the transported object mounted on the second hand in the up-down direction, in the teaching step, the position in the up-down direction of the transported object for teaching placed in the predetermined position is detected by the first sensor attached to the first hand and the position in the horizontal direction of the transported object for teaching placed in the predetermined position is detected by the second sensor attached to the first hand, and in the calibration step, the second hand is moved to the hand position identified in the teaching step and the transported object for teaching placed in the predetermined position is mounted and taken out onto the second hand, thereafter, the second hand is moved again to the hand position identified in the teaching step and the transported object for teaching is placed on the placing section, and then the position in the horizontal direction of the transported object for teaching placed on the placing section is preferably detected by the second sensor attached to the first hand.

In such a configuration, in the calibration step, the transported object for teaching is able to be transported by the second hand to which the first sensor and the second sensor are not attached. Therefore, for example, even in a case where the first sensor or the second sensor is placed in a position in which transportation of the transported object for teaching by the hand may be disturbed, the transported object for teaching is able to be transported by the second hand in the calibration step with the first sensor and the second sensor attached to the first hand.

In at least an embodiment of the disclosure, at the time of execution of the teaching step and the calibration step, a tool for teaching including the first sensor and the second sensor is preferably already attached to the first hand. In such a configuration, the tool for teaching attached to the first hand includes the first sensor and the second sensor. Therefore, for example, even in a case where the first sensor or the second sensor is placed in a position in which transportation of the transported object for teaching by the first hand may be disturbed, the first sensor and the second sensors are able to be easily removed from the first hand after teaching for the industrial robot is performed. Additionally, in the event of performing teaching for the industrial robot, the first sensor and the second sensor are able to be easily attached to the first hand.

In at least an embodiment of the disclosure, the first hand is preferably placed above the second hand. In such a configuration, the tool for teaching is easily attached compared to a case where the first hand is placed below the second hand.

In at least an embodiment of the disclosure, for example, the industrial robot includes: a first hand drive mechanism that rotates the first hand to the arm; a second hand drive mechanism that rotates the second hand to the arm; an arm drive mechanism that extends and retracts the arm as an articulated arm; and a lifting mechanism that lifts the arm up and down. The transported object is provided in a disk shape. The hand includes a grip mechanism that makes contact from at least three directions with an end surface of the transported object mounted on the hand and holds the transported object at a fixed position in the horizontal direction. When the rotation angle of the first hand to the arm is equal to the rotation angle of the second hand to the arm, the center of the transported object on the first hand held by the grip mechanism coincides, as viewed in the up-down direction, with the center of the transported object on the second hand held by the grip mechanism.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An industrial robot for transporting a transported object, comprising:
    a first hand and a second on which the transported object is mounted;
    an arm with a distal end side to which the first hand and the second are connected rotatably about an up-down direction as an axis direction of rotation; and
    a controller that controls the industrial robot,
    wherein the controller continuously and automatically executes a teaching step of allowing the industrial robot to learn a hand position that is a position in the up-down direction and a horizontal direction of the first hand when mounting, on the first hand, the transported object placed in a predetermined position on a placing section on which the transported object is mounted and when placing, in the predetermined position, the transported object mounted on the first hand, and a calibration step of, after the teaching step, correcting the hand position learned in the teaching step,
    wherein as viewed in the up-down direction, when a rotation center of the first hand to the arm coincides with a rotation center of the second hand to the arm and when a rotation angle of the first hand to the arm is equal to a rotation angle of the second hand to the arm, the transported object mounted on the first hand is overlapped with the transported object mounted on the second hand in the up-down direction,
    at the time of execution of the teaching step, a dummy transported object provided in a shape identical to that of the transported object or the transported object is already placed in the predetermined position, and
    in response to the transported object or the dummy transported object placed in the predetermined position being a transported object for teaching,
    in the teaching step, a position in the up-down direction of the transported object for teaching placed in the predetermined position is detected by a first sensor attached to the first hand and a position in the horizontal direction of the transported object for teaching placed in the predetermined position is detected by a second sensor attached to the first hand, and the controller identifies and learns the hand position based on detection results by the first sensor and the second sensor, and
    in the calibration step, the second hand is moved to the hand position identified in the teaching step and the transported object for teaching placed in the predetermined position is mounted and taken out onto the second hand, thereafter, the second hand is moved again to the hand position identified in the teaching step and the transported object for teaching is placed on the placing section, and then the position in the horizontal direction of the transported object for teaching placed on the placing section is detected by the second sensor attached to the first hand, and the controller corrects, based on a detection result by the second sensor, the position in the horizontal direction of the hand position learned in the teaching step.

2. The industrial robot according to claim 1, wherein at the time of execution of the teaching step and the calibration step, a tool for teaching comprising the first sensor and the second sensor is already attached to the first hand.

3. The industrial robot according to claim 2, wherein the first hand is disposed above the second hand.

4. The industrial robot according to claim 1, comprising a first hand drive mechanism that rotates the first hand to the arm; a second hand drive mechanism that rotates the second hand to the arm; an arm drive mechanism that extends and retracts the arm as an articulated arm; and a lifting mechanism that lifts the arm up and down,
    wherein the transported object is provided in a disk shape,
    the hand comprises a grip mechanism that makes contact from at least three directions with an end surface of the transported object mounted on the hand and holds the transported object at a fixed position in the horizontal direction, and
    when the rotation angle of the first hand to the arm is equal to the rotation angle of the second hand to the arm, a center of the transported object on the first hand held by the grip mechanism coincides, as viewed in the up-down direction, with a center of the transported object on the second hand held by the grip mechanism.

5. A teaching method for an industrial robot comprising a first hand and a second on which a transported object is mounted, and an arm with a distal end side to which the first hand and the second are connected rotatably about an up-down direction as an axis direction of rotation, the teaching method comprising:

continuously and automatically executing a teaching step of allowing the industrial robot to learn a hand position that is a position in the up-down direction and a horizontal direction of the first hand when mounting, on the first hand, the transported object placed in a predetermined position on a placing section on which the transported object is mounted and when placing, in the predetermined position, the transported object mounted on the first hand, and a calibration step of, after the teaching step, correcting the hand position learned in the teaching step, wherein as viewed in the up-down direction, when a rotation center of the first hand to the arm coincides with a rotation center of the second hand to the arm and when a rotation angle of the first hand to the arm is equal to a rotation angle of the second hand to the arm, the transported object mounted on the first hand is overlapped with the transported object mounted on the second hand in the up-down direction, wherein at the time of execution of the teaching step, a dummy transported object provided in a shape identical to that of the transported object or the transported object is already placed in the predetermined position, and in response to the transported object or the dummy transported object placed in the predetermined position being a transported object for teaching, in the teaching step, a position in the up-down direction of the transported object for teaching placed in the predetermined position is detected by a first sensor attached to the first hand and a position in the horizontal direction of the transported object for teaching placed in the predetermined position is detected by a second sensor attached to the first hand, and the hand position is identified and learned based on detection results by the first sensor and the second sensor, and in the calibration step, the second hand is moved to the hand position identified in the teaching step and the transported object for teaching placed in the predetermined position is mounted and taken out onto the second hand, thereafter, the second hand is moved again to the hand position identified in the teaching step and the transported object for teaching is placed on the placing section, and then the position in the horizontal direction of the transported object for teaching placed on the placing section is detected by the second sensor attached to the first hand, and based on a detection result by the second sensor, the position in the horizontal direction of the hand position learned in the teaching step is corrected.

\* \* \* \* \*